United States Patent
Chen et al.

(10) Patent No.: US 8,050,649 B2
(45) Date of Patent: Nov. 1, 2011

(54) DOWNCONVERSION MIXER WITH IM2 CANCELLATION

(75) Inventors: Minghui Chen, Los Angeles, CA (US); Yue Wu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 261 days.

(21) Appl. No.: 11/216,857

(22) Filed: Aug. 30, 2005

(65) Prior Publication Data

US 2007/0049215 A1   Mar. 1, 2007

(51) Int. Cl.
*H04B 1/26* (2006.01)
(52) U.S. Cl. ........... 455/326; 455/333; 455/189.1; 455/190.1; 455/209; 327/359
(58) Field of Classification Search ............. 455/86, 455/87, 550.1, 570, 130, 131, 189.1, 190.1, 455/310, 191.1, 200.1, 220, 323, 293, 326, 455/296, 232.1, 234.1, 303, 305, 311, 295, 455/63.1, 330, 332, 207–209, 126; 327/113, 327/355, 356, 359
See application file for complete search history.

(56) References Cited

U.S. PATENT DOCUMENTS

| | | | | |
|---|---|---|---|---|
| 2,686,256 A | * | 8/1954 | Albersheim | 455/59 |
| 3,231,819 A | * | 1/1966 | Aaron | 455/42 |
| 3,736,486 A | * | 5/1973 | Gould et al. | 318/624 |
| 5,041,796 A | * | 8/1991 | Nambu et al. | 330/277 |
| 5,481,389 A | * | 1/1996 | Pidgeon et al. | 398/208 |
| 5,752,181 A | * | 5/1998 | Vice | 455/326 |
| 5,789,927 A | * | 8/1998 | Belcher | 324/622 |
| 5,801,595 A | * | 9/1998 | Davis et al. | 332/170 |
| 6,125,272 A | * | 9/2000 | Bautista et al. | 455/326 |
| 6,130,548 A | * | 10/2000 | Koifman | 326/21 |
| 6,177,836 B1 | * | 1/2001 | Young et al. | 330/43 |
| 6,208,849 B1 | * | 3/2001 | Cho et al. | 455/296 |
| 6,243,430 B1 | * | 6/2001 | Mathe | 375/346 |
| 6,339,701 B1 | * | 1/2002 | Myer et al. | 455/112 |

(Continued)

FOREIGN PATENT DOCUMENTS

JP   2000515342   11/2000

(Continued)

OTHER PUBLICATIONS

International Search Report and Written Opinion—PCT/US2006/033936, International Search Authority—European Patent Office—Dec. 22, 2006.

*Primary Examiner* — Dominic E Rego
(74) *Attorney, Agent, or Firm* — Howard H. Seo

(57) ABSTRACT

A downconversion mixer with IM2 cancellation includes a mixer, an IM2 generator, and a scaling unit. The mixer frequency downconverts an input RF signal with an LO signal and generates an output baseband signal. The IM2 generator includes first and second field effect transistors (FETs) that receive the input RF signal and generate an intermediate signal having IM2 distortion. The scaling unit scales the intermediate signal to generate a scaled signal and further combines the scaled signal with the output baseband signal to cancel IM2 distortion in the output baseband signal. The IM2 generator may further include first and second amplifiers coupled between the source and gate of the first and second FETs, respectively. Different amounts of IM2 distortion and different temperature variation patterns may be generated in the intermediate signal by using different gains for the amplifiers.

17 Claims, 8 Drawing Sheets

U.S. PATENT DOCUMENTS

| | | | |
|---|---|---|---|
| 6,535,725 B2* | 3/2003 | Hatcher et al. | 455/317 |
| 6,549,074 B2* | 4/2003 | Ugajin et al. | 330/258 |
| 6,606,484 B1* | 8/2003 | Faulkner | 455/131 |
| 6,668,164 B2* | 12/2003 | Hughes | 455/234.1 |
| 6,882,834 B1* | 4/2005 | Balboni | 455/255 |
| 6,917,328 B2* | 7/2005 | Rabinowitz et al. | 342/357.06 |
| 6,963,734 B2* | 11/2005 | Sorrells et al. | 455/296 |
| 6,973,297 B1* | 12/2005 | Manku et al. | 455/323 |
| 7,010,319 B2* | 3/2006 | Hunzinger | 455/522 |
| 7,058,400 B2* | 6/2006 | Brooks | 455/424 |
| 7,139,546 B1* | 11/2006 | Petrov et al. | 455/323 |
| 7,177,613 B2* | 2/2007 | Kamath et al. | 455/278.1 |
| 7,194,022 B2* | 3/2007 | Honkanen et al. | 375/216 |
| 7,197,091 B1* | 3/2007 | Petrov et al. | 375/332 |
| 7,197,291 B2* | 3/2007 | Mach et al. | 455/303 |
| 7,245,895 B2* | 7/2007 | Inamori et al. | 455/249.1 |
| 7,263,344 B2* | 8/2007 | Manku | 455/323 |
| 7,299,021 B2* | 11/2007 | Parssinen et al. | 455/226.1 |
| 2002/0123319 A1* | 9/2002 | Peterzell | 455/296 |
| 2002/0160740 A1* | 10/2002 | Hatcher et al. | 455/317 |
| 2003/0007377 A1* | 1/2003 | Otaka | 363/127 |
| 2003/0064695 A1* | 4/2003 | Shi | 455/302 |
| 2003/0122622 A1* | 7/2003 | Gharpurey | 330/254 |
| 2003/0124999 A1* | 7/2003 | Parssinen et al. | 455/226.1 |
| 2003/0137350 A1* | 7/2003 | Yang | 330/254 |
| 2003/0145328 A1* | 7/2003 | Rabinowitz et al. | 725/72 |
| 2003/0179041 A1* | 9/2003 | Weldon | 330/149 |
| 2003/0186664 A1* | 10/2003 | Shah | 455/232.1 |
| 2003/0207674 A1* | 11/2003 | Hughes | 455/234.1 |
| 2003/0216128 A1* | 11/2003 | Zhou | 455/127.1 |
| 2003/0227964 A1* | 12/2003 | Honkanen et al. | 375/216 |
| 2003/0232621 A1* | 12/2003 | Brooks | 455/424 |
| 2004/0198295 A1* | 10/2004 | Nicholls et al. | 455/296 |
| 2004/0214547 A1* | 10/2004 | Kim et al. | 455/296 |
| 2005/0101281 A1* | 5/2005 | Schelmbauer | 455/323 |
| 2005/0140402 A1* | 6/2005 | Sung et al. | 327/113 |
| 2005/0143043 A1* | 6/2005 | Kerth | 455/334 |
| 2005/0170806 A1* | 8/2005 | Kim | 455/323 |
| 2006/0046767 A1* | 3/2006 | Hunzinger | 455/522 |
| 2006/0068746 A1* | 3/2006 | Feng et al. | 455/323 |
| 2006/0148438 A1* | 7/2006 | Manku | 455/313 |
| 2006/0183453 A1* | 8/2006 | Muhammad et al. | 455/283 |
| 2007/0037543 A1* | 2/2007 | Vlemmings | 455/314 |
| 2007/0049215 A1* | 3/2007 | Chen et al. | 455/86 |
| 2007/0049224 A1* | 3/2007 | Womac | 455/189.1 |
| 2007/0066267 A1* | 3/2007 | Ashby et al. | 455/314 |
| 2007/0123182 A1* | 5/2007 | Dekker | 455/114.1 |
| 2007/0178870 A1* | 8/2007 | Kerth | 455/313 |
| 2007/0218857 A1* | 9/2007 | Ismail et al. | 455/323 |
| 2007/0241812 A1* | 10/2007 | Yang et al. | 330/75 |
| 2007/0243848 A1* | 10/2007 | Behzad | 455/326 |
| 2007/0264959 A1* | 11/2007 | Carrez | 455/323 |

FOREIGN PATENT DOCUMENTS

| | | |
|---|---|---|
| WO | 03065602 | 8/2003 |

* cited by examiner

DOWNCONVERSION MIXER WITH IM2 CANCELLATION

BACKGROUND

I. Field

The present disclosure relates generally to electronics, and more specifically to a downconversion mixer in a receiver.

II. Background

In a digital communication system, a transmitter processes traffic data to generate data chips and further modulates a local oscillator (LO) signal with the data chips to generate a radio frequency (RF) modulated signal. The transmitter then transmits the RF modulated signal via a communication channel. The communication channel degrades the RF modulated signal with noise and possibly interference from other transmitters.

A receiver receives the transmitted RF modulated signal, downconverts the received RF signal from RF to baseband, digitizes the baseband signal to generate samples, and digitally processes the samples to recover the traffic data sent by the transmitter. The receiver uses one or more downconversion mixers to frequency downconvert the received RF signal from RF to baseband. An ideal mixer simply translates an input signal from one frequency to another frequency without distorting the input signal. A practical mixer, however, has non-linear characteristics that can result in the generation of various intermodulation components. One such intermodulation component is second order intermodulation (IM2) distortion that is generated by second order non-linearity in the mixer. IM2 distortion is problematic for a downconversion mixer because the magnitude of the IM2 distortion may be large and the IM2 distortion may fall on top of the baseband signal, which can then degrade the performance of the receiver.

There is therefore a need in the art for a downconversion mixer that can mitigate the adverse effects of IM2 distortion.

SUMMARY

A downconversion mixer with IM2 cancellation is described herein. The downconversion mixer can generate different (and large) amounts of IM2 distortion, provide good noise performance, and achieve temperature compensation.

In an embodiment, the downconversion mixer includes a mixer, an IM2 generator, and a scaling unit. The mixer frequency downconverts an input RF signal with an LO signal and generates an output baseband signal. The IM2 generator includes first and second field effect transistors (FETs) that receive the input RF signal and generate an intermediate signal having IM2 distortion. The scaling unit scales the intermediate signal to generate a scaled signal and further combines the scaled signal with the output baseband signal to cancel IM2 distortion in the output baseband signal.

The IM2 generator may further include first and second amplifiers, with the first amplifier being coupled between the source and gate of the first FET and the second amplifier being coupled between the source and gate of the second FET. Different amounts of IM2 distortion may be generated in the intermediate signal by using different gains for the amplifiers. IM2 distortion with different temperature variation patterns may also be generated by using different temperature coefficients for the gains of the amplifiers, which may be provided by different sets of resistors. The scaling unit scales the intermediate signal with a scaling gain that is selected to reduce IM2 distortion in the output baseband signal.

For a quadrature downconversion mixer, one set of mixer and scaling unit is used to generate an inphase (I) baseband signal, and another set of mixer and scaling unit is used to generate a quadrature (Q) baseband signal. A single IM2 generator may be used for both I and Q baseband signals. The two scaling units can independently cancel the IM2 distortions in the I and Q baseband signals from the two mixers.

Various aspects and embodiments of the invention are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

The downconversion mixer with IM2 cancellation described herein may be used for a direct-conversion receiver and possibly other types of receiver. The direct-conversion receiver frequency downconverts the receive RF signal from RF directly to baseband in one stage. Other types of receiver perform frequency downconversion in multiple stages. The different types of receivers may use different circuit blocks and/or have different circuit requirements. For clarity, the downconversion mixer is described below for the direct-conversion receiver.

Figure 1:
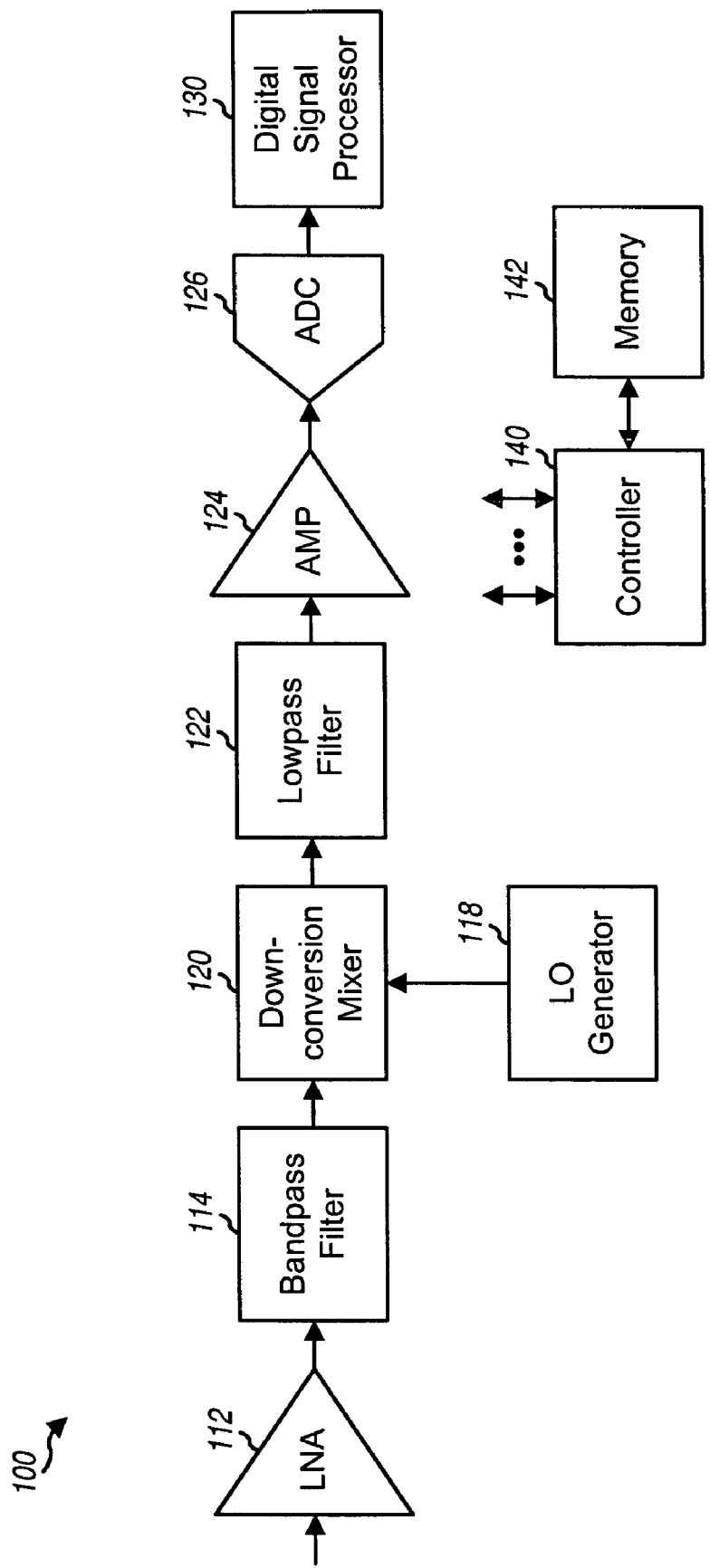
FIG. 1 shows a block diagram of a direct-conversion receiver.

FIG. 1 shows a block diagram of a direct-conversion receiver 100. Within receiver 100, a low noise amplifier (LNA) 112 amplifies a received RF signal with a fixed or variable gain and provides an amplified RF signal. A bandpass filter 114 filters the amplified RF signal and provides an input RF signal. Bandpass filter 114 passes signal components in the frequency band of interest and removes out-of-band noise and undesired signal components. Bandpass filter 114 may be implemented with a surface acoustic wave (SAW) filter or some other filter.

A downconversion mixer 120 frequency downconverts the input RF signal with I and Q LO signals from an LO generator 118 and provides I and Q baseband signals. An LO signal is a carrier signal at a desired frequency. The I and Q LO signals are 90° out of phase but have the same frequency. The frequency of the LO signals is selected such that the signal component in an RF channel of interest is downconverted to baseband or near baseband. A lowpass filter 122 filters the I and Q baseband signals to pass the signal components in the RF channel of interest and to remove noise and undesired signal components that may have been generated by the downconversion process. An amplifier (AMP) 124 amplifies the I and Q filtered signals from lowpass filter 122 with a fixed or variable gain. An analog-to-digital converter (ADC) 126 digitizes the I and Q analog signals from amplifier 124 and provides data samples to a digital signal processor (DSP) 130. DSP 130 performs digital signal processing (e.g., demodulation, deinterleaving, decoding, and so on) on the data samples, as specified by the system.

A controller 140 directs the operations of various processing units within receiver 100. A memory unit 142 stores data and program codes for controller 140.

FIG. 1 shows a specific design for receiver 100. In general, a receiver may perform signal conditioning using one or more stages of amplifier, filter, mixer, and so on, which may be arranged differently from the design shown in FIG. 1. Furthermore, a receiver may employ other circuit blocks not shown in FIG. 1.

Figure 2A:
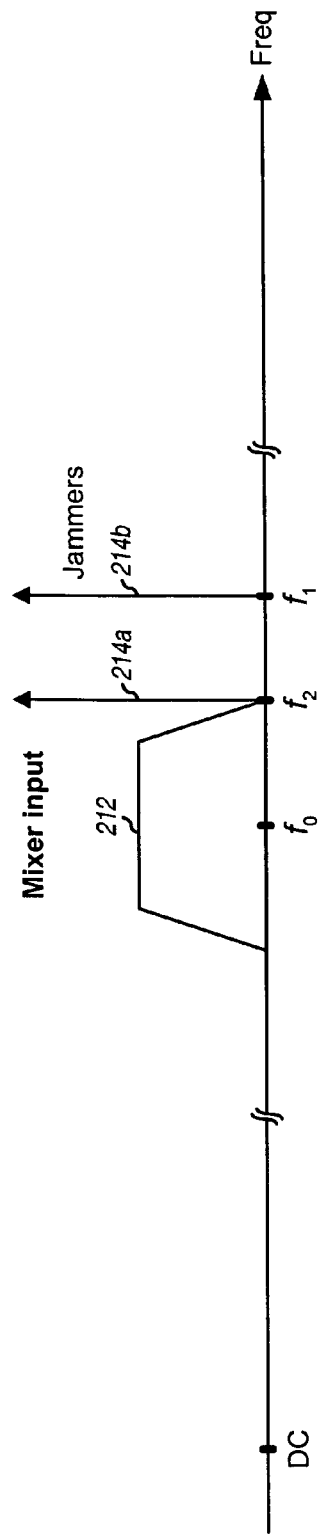
FIGS. 2A, 2B and 2C show a mixer input signal, a mixer output signal without IM2 cancellation, and a mixer output signal with IM2 cancellation, respectively.

FIG. 2A shows an exemplary input RF signal at the input of downconversion mixer 120. The input RF signal includes a desired signal component 212 centered at a frequency of $f_0$ and two undesired signal components 214a and 214b at frequencies of $f_2$ and $f_1$, respectively. The undesired signal components are also called jammers and may correspond to signals transmitted by an interfering transmitter. The jammers may be much higher in amplitude than the desired signal component and may be located close in frequency to the desired signal component.

For cdma2000, the desired CDMA signal has a bandwidth of 1.23 MHz. IS-98D specifies a two-tone test that is applicable to cdma2000 receivers. For this test, two tones are located at +900 KHz and +1700 KHz from the center frequency of the CDMA signal and are 58 dB higher in amplitude than the CDMA signal level. These two tones model large amplitude interfering signals transmitted by a nearby base station in an Advanced Mobile Phone Service (AMPS) system.

Figure 2B:
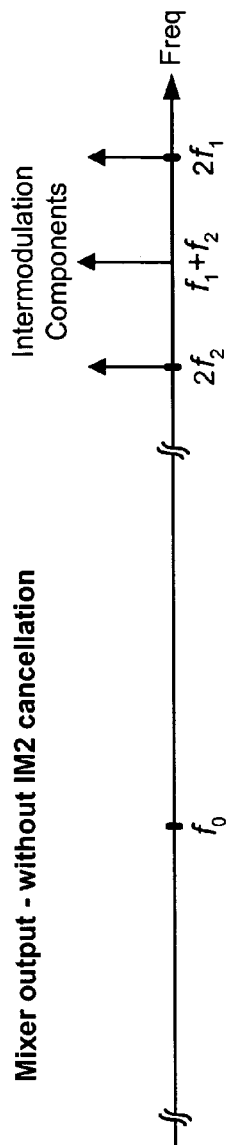

FIG. 2B shows a baseband signal at the output of downconversion mixer 120 without IM2 cancellation. Non-linearity in mixer 120 can cause intermodulation components at various frequencies including $f_1-f_2$, $f_1+f_2$, $2f_1$ and $2f_2$, as shown in FIG. 2B. For simplicity, other intermodulation components at frequencies such as $f_1-f_0$ and $f_2-f_0$ are not shown in FIGS. 2B and 2C. The intermodulation components at higher frequencies such as $f_1+f_2$, $2f_1$ and $2f_2$ can be filtered out easily. The IM2 distortion at frequency $f_1-f_2$ is more problematic since it is close in frequency to the desired signal component and is difficult to filter out. The IM2 distortion acts as additional noise that may degrade the performance of the receiver.

Figure 2C:

FIG. 2C shows a baseband signal with IM2 cancellation. The IM2 distortion may be estimated and canceled from the baseband signal. If the IM2 cancellation is effective, then the baseband signal may be essentially free of IM2 distortion, and improved performance may be achieved for the receiver.

IM2 calibration may be performed to ascertain the amounts of IM2 distortion in the I and Q baseband signals and to determine the amount of IM2 distortion to generate for each baseband signal in order to cancel the IM2 distortion in that baseband signal. IM2 calibration may be performed, e.g., during manufacturing or testing of an RF integrated circuit (RFIC) that contains the downconversion mixer. IM2 cancellation may be performed during normal operation of the downconversion mixer.

Figure 3:
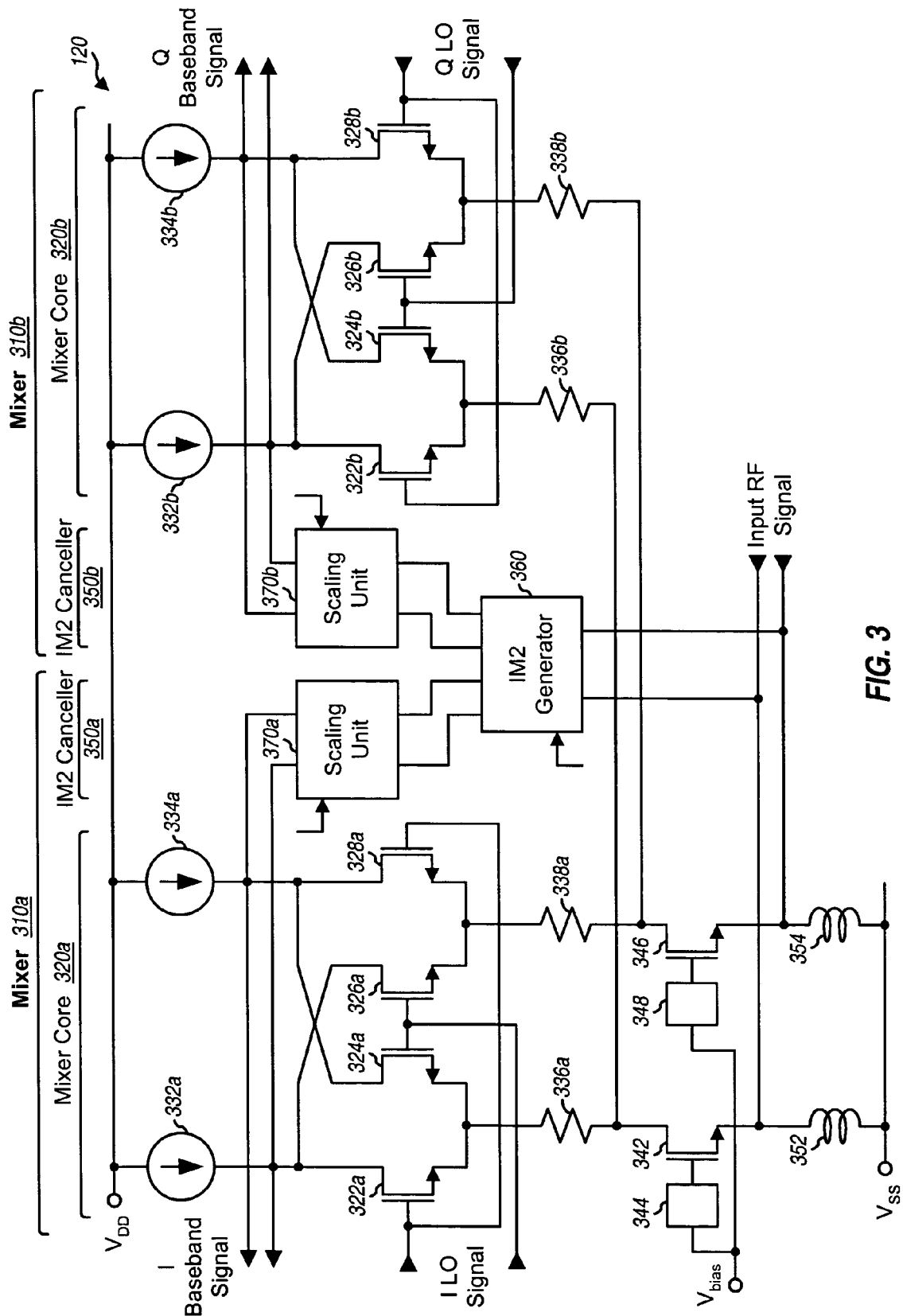
FIG. 3 shows a downconversion mixer with IM2 cancellation.

FIG. 3 shows an embodiment of downconversion mixer 120 with IM2 cancellation. Downconversion mixer 120 includes a mixer 310a for the I baseband signal and a mixer 310b for the Q baseband signal. Each mixer 310 includes a mixer core 320 and an IM2 canceller 350.

For the embodiment shown in FIG. 3, each mixer core 320 includes four N-channel FETs (N-FETs) 322, 324, 326 and 328 coupled as a Gilbert cell multiplier. N-FETs 322 and 324 have their drains coupled to current sources 332 and 334, respectively, and their sources coupled together and to one end of a resistor 336. Similarly, N-FETs 326 and 328 have their drains coupled to current sources 332 and 334, respectively, and their sources coupled together and to one end of a resistor 338. The gates of N-FETs 322 and 328 couple together, and the gates of N-FETs 324 and 326 couple together. Current sources 332 and 334 further couple to an upper supply voltage $V_{DD}$, provide bias currents for N-FETs 322 through 328, and also act as active loads for these N-FETs.

An N-FET 342 has its drain coupled to the other ends of resistors 336a and 336b, its gate coupled to one end of a bias network 344, and its source coupled to one end of an inductor 352. Similarly, an N-FET 346 has its drain coupled to the other ends of resistors 338a and 338b, its gate coupled to one end of a bias network 348, and its source coupled to one end of an inductor 354. N-FETs 342 and 346 are RF common gate amplifiers. Bias networks 344 and 348 receive a bias voltage $V_{bias}$ on the other ends and generate the proper gate bias voltages for N-FETs 342 and 346, respectively. The other ends of inductors 352 and 354 couple to a lower supply voltage $V_{SS}$, which may be circuit ground.

For mixer core 320a for the I component, a differential input RF signal is provided to the sources of N-FETs 342 and 346. A differential I LO signal is provided to the gates of N-FETs 322a and 324a and also to the gates of N-FETs 328a and 326a. A differential I baseband signal is provided by the drains of N-FETs 322a, 324a, 326a and 328a.

Mixer core 320b for the Q component is coupled in similar manner as mixer core 320a for the I component. Resistors 336b and 338b within mixer core 320b are coupled to the drains of N-FETs 342 and 346, respectively. A differential Q LO signal is provided to the gates of N-FETs 322b and 324b and also to the gates of N-FETs 328b and 326b. A differential Q baseband signal is provided by the drains of N-FETs 322b, 324b, 326b and 328b.

IM2 cancellers 350a and 350b include scaling units 370a and 370b, respectively, and further share an IM2 generator 360. IM2 generator 360 generates an intermediate signal containing IM2 distortion having the same frequency spectrum as the IM2 distortions in the I and Q baseband signals from mixer cores 320a and 320b, respectively. Scaling unit 370a adjusts the magnitude and polarity of the intermediate signal from IM2 generator 360 and generates a first scaled signal having IM2 distortion that is approximately equal in magnitude but opposite in polarity as the IM2 distortion in the I baseband signal from mixer core 320a. The output from scaling unit 370a is combined with the output from mixer core 320a, and the IM2 distortion from scaling unit 370a cancels the IM2 distortion from mixer core 320a, resulting in the I baseband signal having low IM2 distortion.

Scaling unit 370b similarly adjusts the magnitude and polarity of the intermediate signal from IM2 generator 360 and generates a second scaled signal having IM2 distortion that is approximately equal in magnitude but opposite in polarity as the IM2 distortion in the Q baseband signal from mixer core 320b. The output from scaling unit 370b is combined with the output from mixer core 320b, and the IM2 distortion from scaling unit 370b cancels the IM2 distortion from mixer core 320b, resulting in the Q baseband signal having low IM2 distortion.

The input RF signal for downconversion mixer 120 may be expressed as:

$$V_{mixer} = V_{dc\_mixer} + V_{rf\_mixer}, \qquad \text{Eq (1)}$$

where $V_{dc\_mixer}$ is the direct current (DC) portion of the input RF signal and $V_{rf\_mixer}$ is the RF portion of the input RF signal. The LO signal for each mixer core 320 has an amplitude of $V_{lo}$ and a frequency of $\omega_0$ radians/second.

The output current $I_{mixer}$ for each mixer core 320 may be expressed as:

$$\begin{aligned} I_{mixer} &= f(V_{dc\_mixer} + V_{rf\_mixer}, V_{lo}), & \text{Eq (2)} \\ &\approx f(V_{dc\_mixer}, V_{lo}) + f'(V_{dc\_mixer}, V_{lo}) \cdot V_{rf\_mixer} + \\ & \quad \frac{1}{2!} f''(V_{dc\_mixer}, V_{lo}) \cdot V_{rf\_mixer}^2, \\ &= a_0 + a_1 \cdot V_{rf\_mixer} + a_2 \cdot V_{rf\_mixer}^2, \end{aligned}$$

where $f(u,v)$, $f'(u,v)$, and $f''(u,v)$ are functions of variables u and v and are determined by non-linearity of the mixer core; and $a_0$, $a_1$ and $a_2$ are coefficients comprising $f(u,v)$, $f'(u,v)$ and $f''(u,v)$, respectively, and are functions of $\omega_0 t$.

The input RF signal may include two jammers at $\omega_1 = 2\pi \cdot f_1$ and $\omega_2 = 2\pi \cdot f_2$, as shown in FIG. 2A, and may be expressed as:

$$V_{rf\_mixer} = V_1 \cdot \cos(\omega_1 t + \theta_1) + V_2 \cdot \cos(\omega_2 t + \theta_2), \qquad \text{Eq (3)}$$

where $V_1$ and $V_2$ are the amplitudes of the two jammers and $\theta_1$ and $\theta_2$ are the arbitrary phases of the two jammers. The mixer IM2 current $I_{im2\_mixer}$, which is the IM2 component of the mixer output current, may then be expressed as:

$$I_{im2\_mixer} = \frac{1}{2} \bar{a}_2 \cdot V_1 \cdot V_2 \cdot \cos[(\omega_1 - \omega_2) \cdot t + (\theta_1 - \theta_2)], \qquad \text{Eq (4)}$$

where $\bar{a}_2$ is the time average of coefficient $a_2$ for one period of the LO signal.

The input RF signal is also provided to IM2 generator 360 and used to generate IM2 distortion. Within IM2 generator 360, the input RF signal is amplified based on a voltage gain of $A_V$ to generate a scaled RF signal, or $V_{rf\_gen} = (1 - A_V) \cdot V_{rf\_mixer}$. The scaled RF signal is applied to an IM2 distortion generation circuit within IM2 generator 360. The output current $I_{gen}$ from IM2 generator 360 may be expressed as:

$$\begin{aligned} I_{gen} &= g(V_{dc\_gen} + V_{rf\_gen}), & \text{Eq (5)} \\ &\approx g(V_{dc\_gen}) + g'(V_{dc\_gen}) \cdot V_{rf\_gen} + \\ & \quad \frac{1}{2!} g''(V_{dc\_gen}) \cdot V_{rf\_gen}^2, \\ &= b_0 + b_1 \cdot V_{rf\_gen} + b_2 \cdot V_{rf\_gen}^2, \end{aligned}$$

where $V_{gen} = V_{dc\_gen} + V_{rf\_gen}$ is the input signal to the IM2 distortion generation circuit;

g(z), g'(z), and g''(z) are functions of variable z and are determined by non-linearity of the IM2 distortion generation circuit; and $b_0$, $b_1$ and $b_2$ are coefficients comprising g(z), g'(z), and g''(z), respectively.

If the input RF signal includes two jammers at $\omega_1 = 2\pi \cdot f_1$ and $\omega_2 = 2\pi \cdot f_2$ as shown in equation (3), then the scaled RF signal may be expressed as:

$$V_{rf\_gen} = V'_1 \cdot \cos(\omega_1 t + \theta_1) + V'_2 \cdot \cos(\omega_2 t + \theta_2), \qquad \text{Eq (6)}$$

where $V'_1$ and $V'_2$ are the amplitudes of the two jammers in the scaled RF signal, with $V'_1 = (1 - A_V) \cdot V_1$ and $V'_2 = (1 - A_V) \cdot V_2$. The generated IM2 current $I_{im2\_gen}$, which is the IM2 component of the output current from IM2 canceller 360, may then be expressed as:

$$I_{im2\_gen} = \frac{1}{2} \bar{b}_2 \cdot V'_1 \cdot V'_2 \cdot \cos[(\omega_1 - \omega_2)t + (\theta_1 - \theta_2)], \qquad \text{Eq (7)}$$

where $\bar{b}_2$ is the time average of coefficient $b_2$ for one period of the LO signal.

As shown in equations (4) and (7), the mixer IM2 current and the generated IM2 current have the same initial phase of $\theta_1 - \theta_2$ and the same frequency of $\omega_1 - \omega_2$. The ratio of the generated IM2 current to the mixer IM2 current may be expressed as:

$$S = \frac{I_{im2\_cal}}{I_{im2\_mixer}} = \frac{\bar{b}_2}{\bar{a}_2} \cdot (1 - A_V)^2. \qquad \text{Eq (8)}$$

The ratio S is not dependent on the jammer phase, frequency, and power (to the first order). Hence, the ratio S may be determined once by performing IM2 calibration and used thereafter for all operating conditions.

Figure 4:
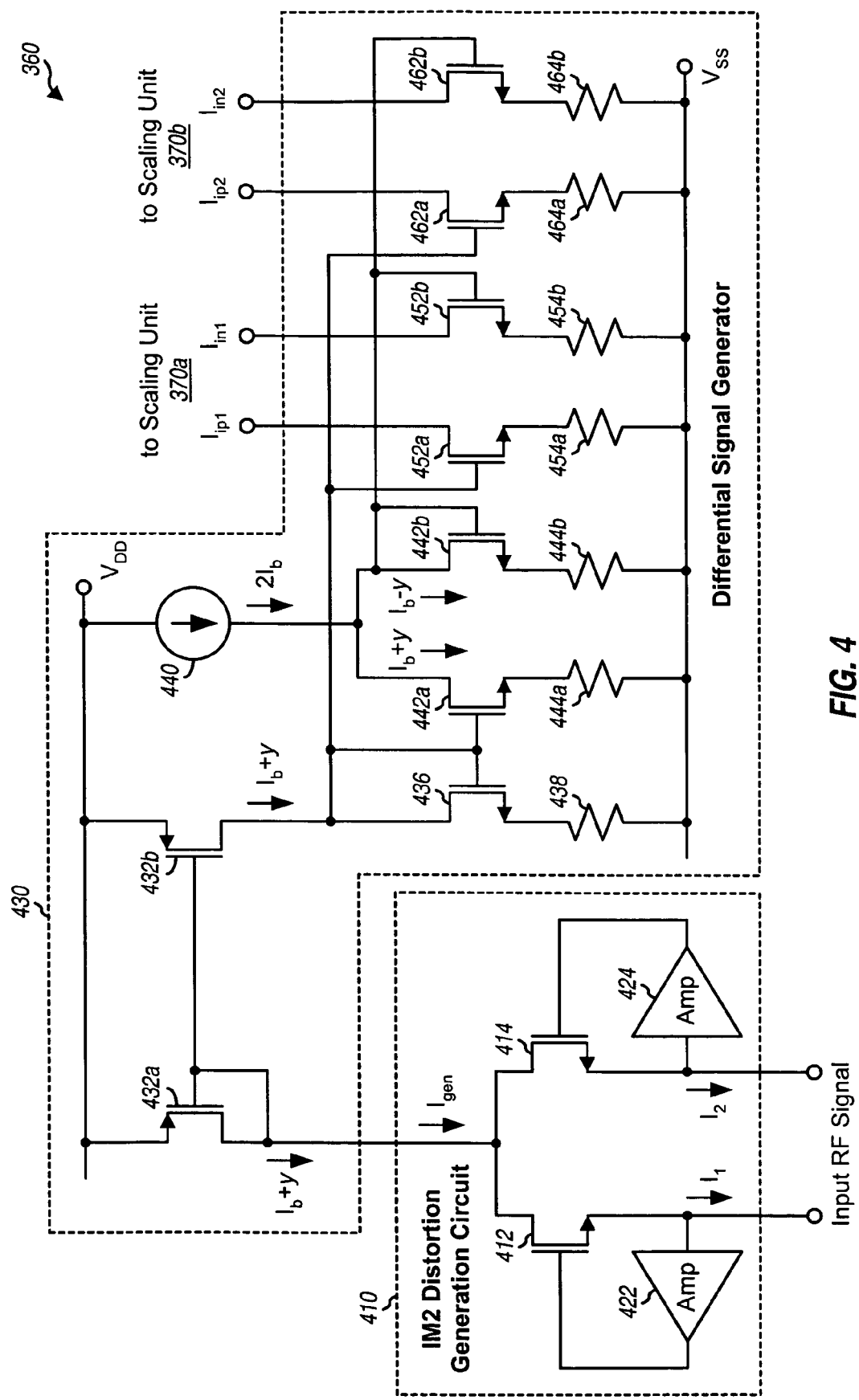
FIG. 4 shows an IM2 generator.

FIG. 4 shows an embodiment of IM2 generator 360. For this embodiment, IM2 generator 360 includes an IM2 distortion generation circuit 410 and a differential signal generator 430. IM2 distortion generation circuit 410 generates a single-ended intermediate signal containing IM2 distortion. Differential signal generator 430 receives the single-ended intermediate signal and generates two differential intermediate signals for scaling units 370a and 370b.

IM2 distortion generation circuit 410 includes two N-FETs 412 and 414 and two amplifiers 422 and 424. N-FETs 412 and 414 are coupled as a differential pair and have their drains coupled together and their sources receiving the differential input RF signal. Amplifier 422 has its input coupled to the source of N-FET 412 and its output coupled to the gate of N-FET 412. Similarly, amplifier 424 has its input coupled to the source of N-FET 414 and its output coupled to the gate of N-FET 414.

N-FETs 412 and 414 may be assumed to have a quadratic law transfer function between the gate-to-source voltage $V_{gs}$ and the drain current. If the input RF signal includes two jammers as shown in equation (3) and if amplifiers 422 and 424 are not present, then the drain current $I_1$ of N-FET 412 may be expressed as:

$$\begin{aligned} I_1 &= \frac{1}{2} \mu_n C_{ox} \frac{W}{L} [V_{GS0} + V_1 \cos(\omega_1 t + \theta_1) + V_2 \cos(\omega_2 t + \theta_2)]^2, & \text{Eq (9)} \\ &= \frac{1}{2} \mu_n C_{ox} \frac{W}{L} V_{GS0}^2 + g_m \\ & \quad [V_1 \cos(\omega_1 t + \theta_1) + V_2 \cos(\omega_2 t + \theta_2)], + \\ & \quad \frac{1}{2} \mu_n C_{ox} \frac{W}{L} [V_1 \cos(\omega_1 t + \theta_1) + V_2 \cos(\omega_2 t + \theta_2)]^2, \end{aligned}$$

and the drain current $I_2$ of N-FET 414, may be expressed as:

$$I_2 = \frac{1}{2}\mu_n C_{ox} \qquad \text{Eq (10)}$$
$$\frac{W}{L}[V_{GS0} - V_1\cos(\omega_1 t + \theta_1) + V_2\cos(\omega_2 t + \theta_2)]^2,$$
$$= \frac{1}{2}\mu_n C_{ox} \frac{W}{L} V_{GS0}^2 - g_m$$
$$[V_1\cos(\omega_1 t + \theta_1) + V_2\cos(\omega_2 t + \theta_2)], +$$
$$\frac{1}{2}\mu_n C_{ox} \frac{W}{L}[V_1\cos(\omega_1 t + \theta_1) + V_2\cos(\omega_2 t + \theta_2)]^2,$$

where $\mu_n$ is the electron mobility, $C_{ox}$ is the oxide capacitance, W is the width of the N-FETs, L is the length of the N-FETs, and $V_{GS0}$ is the DC bias voltage for the N-FETs.

The total current $I_{gen}$ at the drains of N-FETs 412 and 414 may be expressed as:

$$I_{gen} = I_1 + I_2 \qquad \text{Eq (11)}$$
$$= \mu_n C_{ox} \frac{W}{L} V_{GS0}^2 + \mu_n C_{ox} \frac{W}{L}$$
$$[V_1\cos(\omega_1 t + \theta_1) + V_2\cos(\omega_2 t + \theta_2)]^2,$$
$$= \mu_n C_{ox} \frac{W}{L}\left(V_{GS0}^2 + \frac{V_1^2}{2} + \frac{V_2^2}{2}\right) + \mu_n C_{ox} \frac{W}{L} V_1 V_2 \cos$$
$$[(\omega_1 - \omega_2)t + (\theta_1 - \theta_2)] +$$
$$\mu_n C_{ox} \frac{W}{L} V_1 V_2 \cos[(\omega_1 + \omega_2)t + (\theta_1 + \theta_2)] +$$
$$\frac{1}{2}\mu_n C_{ox} \frac{W}{L}[V_1^2\cos(2\omega_1 t + 2\theta_1) + V_2^2\cos(2\omega_2 t + 2\theta_2)].$$

When $I_1$ is combined with $I_2$, the signal term $g_m[V_1\cos(\omega_1 t + \theta_1) + V_2\cos(\omega_2 t + \theta_2)]$ in equations (8) and (9) cancels, the DC term adds, and the square term also adds. On the right hand side of the last equality sign in equation (10), the square term is multiplied out to obtain four components at $\omega_1 - \omega_2$, $\omega_1 + \omega_2$, $2\omega_1$ and $2\omega_2$, which are shown in FIG. 2B.

Equation (11) is for the case without amplifiers 422 and 424. If amplifiers 422 and 424 are connected as shown in FIG. 4 and if each amplifier has a gain of $A_V$, and assuming that $V_1 = V_2 = V$, then the generated IM2 current from IM2 generator 360 may be expressed as:

$$I_{im2\_gen} = \mu_n C_{ox} \frac{W}{L} V^2 (1 - A_V)^2 \cos[(\omega_1 - \omega_2)t + (\theta_1 - \theta_2)] \qquad \text{Eq (12)}$$

The three components at $\omega_1 + \omega_2$, $2\omega_1$ and $2\omega_2$ in the $I_{gen}$ current are at high RF frequencies and are easily filtered by scaling units 370a and 370b.

Amplifiers 422 and 424 provide signal amplification, which can yield the following advantages in the generation of IM2 distortion:

Generation of different and large amounts of IM2 distortion by varying the amplifier gain $A_V$. For example, the IM2 distortion generated with a gain of $A_V = -3$ is 16 times larger than the IM2 distortion generated with a gain of $A_V = 0$.

Reduction of DC current. For example, the same amount of IM2 distortion may be generated with either (1) $A_V = 0$ and $W = W_1$ or (2) $A_V = -3$ and $W = W_1/16$. The DC current required for case (2) is reduced by a factor of 16 in comparison to the DC current required for case (1).

Reduction of output noise. The N-FET channel thermal noise is proportional to the transistor transconductance. Since the transconductance for case (2) above is 1/16 of the transconductance for case (1), the output noise power is reduced by 12 decibels (dB) for case (2). Less noise would then be injected in the mixer output, which may improve performance.

Temperature compensation. Without amplifiers 422 and 424, the temperature variation of $I_{im2\_gen}$ depends solely on mobility variation, which is proportional to $(T/T_0)^{-1.5}$, where T is the temperature for IM2 generator 360 and $T_0$ is room temperature, which is 298° Kelvin. The mixer IM2 current variation versus temperature may be more complex since (1) different mismatch mechanisms within mixer core 320 may have different temperature variation patterns and (2) the total variation for the mixer IM2 current is the superposition of all of these different temperature variation patterns. The gain $A_V$ of amplifiers 422 and 424 may be designed with different temperature coefficients, which then allows for generation of IM2 current with different temperature variation patterns. A temperature coefficient may then be selected for the gain $A_V$ such that the temperature variation of the generated IM2 current resembles the temperature variation of the mixer IM2 current.

Differential signal generator 430 generates two differential intermediate signals. Within generator 430, P-channel FETs (P-FETs) 432a and 432b are coupled as a current mirror and have their gates coupled together and $V_{DD}$. The drain and gate of P-FET 432a couple together and further to the output of circuit 410. The drain of P-FET 432b couples to the drain and gate of an N-FET 436. N-FETs 442a and 442b have their drains coupled together and to one end of a current source 440. The gate of N-FET 442a couples to the gate of N-FET 436, and the gate of N-FET 442b couples to the drain of N-FET 442b. N-FETs 436, 442a, 452a and 462a are coupled as a current mirror and have their gates coupled together. N-FETs 442b, 452b and 462b are coupled as another current mirror and have their gates coupled together. The drains of N-FETs 452a and 452b provide the differential intermediate signal for scaling unit 370a. The drains of N-FETs 462a and 462b provide the differential intermediate signal for scaling unit 370b. Resistors 438, 444a, 444b, 454a, 454b, 464a and 464b couple between $V_{SS}$ and the sources of N-FETs 436, 442a, 442b, 452a, 452b, 462a and 462b, respectively. These resistors reduce output noise currents.

N-FET 432a acts as an active load for N-FETs 412 and 414. The current through N-FET 432a includes a bias current $I_b$ and the generated IM2 current, which is denoted as y. N-FETs 432a and 432b are coupled as a current mirror, and the current through N-FET 432b is equal to the current through N-FET 432a. N-FETs 436 and 442a are also coupled as a current mirror, and the current through N-FET 442a is equal to the current through N-FET 436. The IM2 current via N-FET 442b is inverted with respect to the IM2 current via N-FET 442a since the total current via both N-FETs 442a and 442b is $2I_b$. N-FETs 442a, 452a and 462a are coupled as a current mirror and have the same drain current. N-FETs 442b, 452b and 462b are coupled as another current mirror and have the same drain current.

Figure 5:
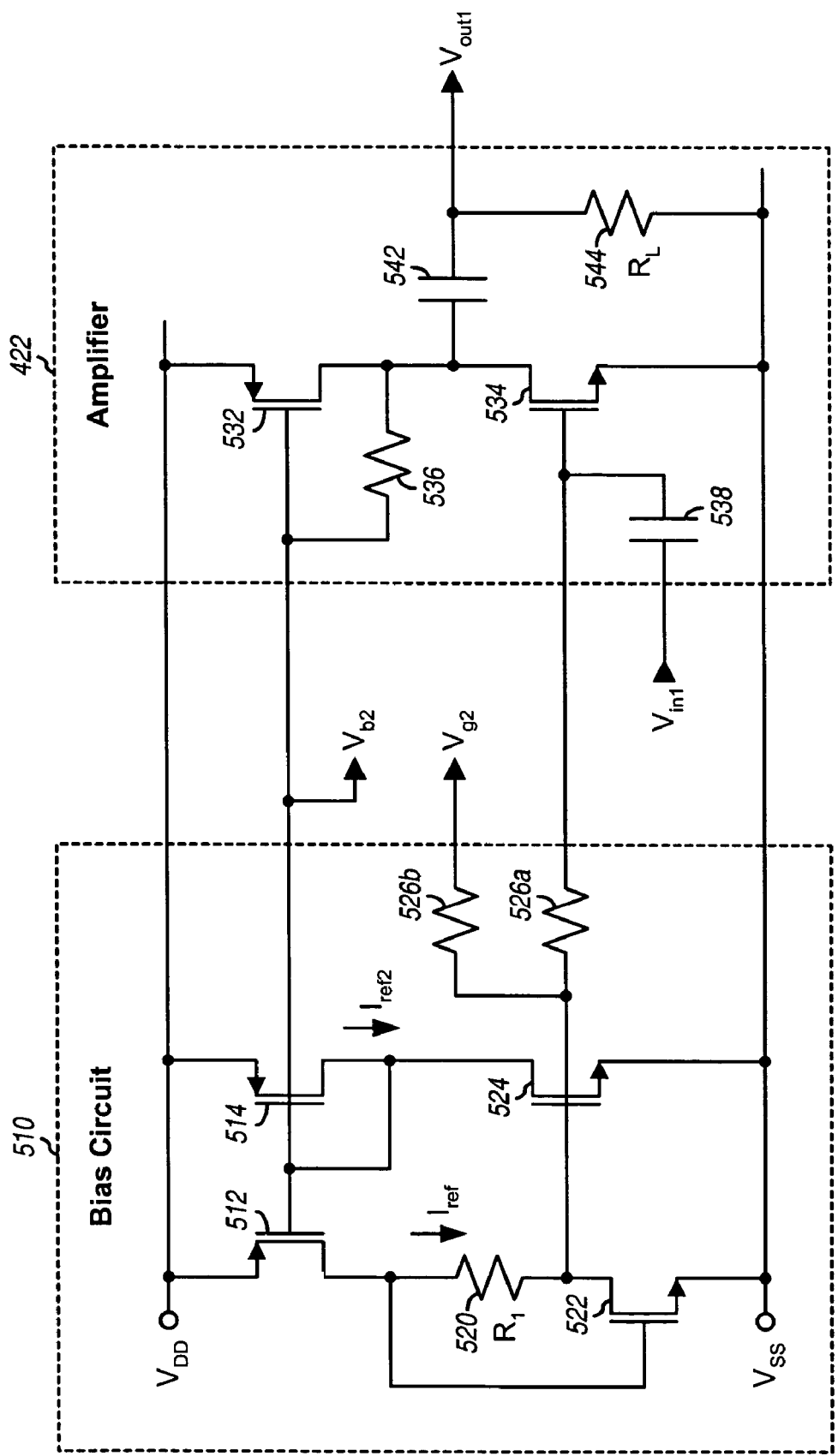
FIG. 5 shows a bias circuit and an amplifier within the IM2 generator.

FIG. 5 shows an embodiment of a bias circuit 510 and amplifier 422 within IM2 generator 360. Bias circuit 510 generates bias currents and bias voltages for amplifiers 422 and 424. Within bias circuit 510, P-FETs 512 and 514 are coupled as a current mirror and have their gates coupled together and their sources coupled to $V_{DD}$. P-FET 514 also has it gate coupled to its drain. A resistor 520 and an N-FET 522 couple in series with P-FET 512. N-FET 522 has its source coupled to $V_{SS}$, its drain coupled to one end of resistor 520, and its gate coupled to the other end of resistor 520 and further to the drain of P-FET 512. An N-FET 524 couples in series with P-FET 514. N-FET 524 has its source coupled to $V_{SS}$, its gate coupled to the drain of N-FET 522, and its drain coupled to the drain of P-FET 514. Resistors 526a and 526b have one end coupled to the drain of N-FET 522. The other end of resistor 526a provides a bias voltage for amplifier 422. The other end of resistor 526b provides a bias voltage $V_{g2}$ for amplifier 424.

Within amplifier 422, a P-FET 532 and an N-FET 534 are coupled in series. P-FET 532 has its source coupled to $V_{DD}$, its gate coupled to the gates of P-FETs 512 and 514, and its drain coupled to the drain of N-FET 534. N-FET 534 has its gate coupled to resistor 526a and its source coupled to $V_{SS}$. A feedback resistor 536 couples between the gate and drain of P-FET 532 and stabilizes the drain voltage of P-FET 532. A DC blocking capacitor 538 couples between the amplifier input $V_{in1}$ and the gate of N-FET 534. Another DC blocking capacitor 542 couples between the drain of N-FET 534 and the amplifier output $V_{out1}$. A load resistor 544 couples between the amplifier output and $V_{SS}$.

Resistor 520 determines the amount of reference current $I_{ref}$ flowing through P-FET 512 and N-FET 522. The $I_{ref}$ current is mirrored through both P-FETs 514 and 532 because P-FETs 512, 514 and 532 have the same $V_{GS}$ voltage. The $I_{ref2}$ current flowing through P-FET 514 and N-FET 524 may be expressed as:

$$I_{ref2} = \frac{2}{\mu_n C_{ox} \frac{W}{L} R_1^2}\left(1 - \frac{1}{\sqrt{K}}\right)^2, \qquad \text{Eq (13)}$$

where $R_1$ is the resistance of resistor 520 and K is the ratio of the width of N-FET 524 to the width of N-FET 522. The transconductance $g'_m$ of N-FET 524 may be expressed as:

$$g'_m = \frac{2}{R_1}(\sqrt{K} - 1). \qquad \text{Eq (14)}$$

N-FET 522 provides the bias voltage for N-FETs 524 and 534 to maintain constant transconductance (constant-$g_m$) for N-FETs 524 and 534. P-FET 532 provides the bias current for N-FET 534 and is also an active load for N-FET 534. The bias current for N-FET 534 is proportional to the $I_{ref2}$ current and is determined by the ratio of the FET geometry. The transconductance $g_m$ of N-FET 534 is likewise proportional to the transconductance $g'_m$ of N-FET 524. N-FET 534 provides amplification for the RF signal at the amplifier input. The voltage gain $A_V$ provided by N-FET 534 may be expressed as:

$$A_V \approx g_m \cdot R_L, \qquad \text{Eq (15)}$$

where $R_L$ is the resistance of load resistor 544. The gain $A_V$ is also affected by the output resistance and drain parasitic capacitances of N-FET 534, which are not shown in equation (15) for simplicity.

Amplifier 424 may be implemented in the same manner as amplifier 422 and may be driven by the $V_{b2}$ and $V_{g2}$ signals from bias circuit 510.

Equations (13) and (14) show the theoretical current and transconductance for N-FET 524. In reality, however, channel length modulation and short channel effects modify the relationships to $I_{ref2} \propto R_1^{-1.42}$ and $g'_m \propto R_1^{-1.82}$. Increasing $R_1$ reduces current consumption but also results in a smaller transconductance $g'_m$ for N-FET 524 and hence a smaller transconductance $g_m$ for N-FET 534. Resistor 520 may be used for gain control as well as for DC current reduction. Furthermore, the temperature coefficient of resistor 520 may be varied to obtain different gain temperature variations.

Each mixer core 320 generates IM2 distortion due to mismatch in various parameters such as, for example, the threshold voltage $V_{th}$ of N-FETs 322 through 328, the width W and length L of these N-FETs, the oxide thickness $t_{ox}$ for these N-FETs, and so on. If the mismatch for each parameter is small, then the mixer IM2 distortion may be approximated as:

$$I_{im2\_mixer} \approx k_1 \cdot \Delta V_{th} + k_2 \cdot \Delta W + k_3 \cdot \Delta L + k_4 \cdot \Delta t_{ox} + \ldots, \qquad \text{Eq (16)}$$

where $\Delta V_{th}$, $\Delta W$, $\Delta L$ and $\Delta t_{ox}$ denote the amount of mismatch in $V_{th}$, W, L and $t_{ox}$, respectively. The mismatches $\Delta V_{th}$, $\Delta W$, $\Delta L$ and $\Delta t_{ox}$ are unknown prior to manufacturing and vary from device to device.

The temperature coefficient for the IM2 distortion may be expressed as:

$$\frac{\partial I_{im2\_mixer}}{\partial T} \cong \qquad \text{Eq (17)}$$
$$\frac{\partial k_1}{\partial T} \cdot \Delta V_{th} + \frac{\partial k_2}{\partial T} \cdot \Delta W + \frac{\partial k_3}{\partial T} \cdot \Delta L + \frac{\partial k_4}{\partial T} \cdot \Delta t_{ox} + \ldots,$$

where $\Delta V_{th}$, $\Delta W$, $\Delta L$ and $\Delta t_{ox}$ are assumed to be independent of temperature T for simplicity. The mismatches may be assumed to be random variables. The temperature coefficients $\partial k_1/\partial T$, $\partial k_2/\partial T$, $\partial k_3/\partial T$, and a $\partial k_4/\partial T$ may also be different. Thus, it would be very difficult (if not impossible) to predict the actual variation in the mixer IM2 distortion with temperature.

To achieve temperature compensation for the mixer IM2 distortion, resistor 520 within bias block 510 may be implemented with a resistor array having different selectable resistor values. Each resistor value corresponds to a different transconductance $g'_m$ shown in equation (14) and hence a different amplifier gain $A_V$ shown in equation (15). The proper resistor value is selected such that the IM2 distortion generated by each mixer core can be canceled.

Figure 6:
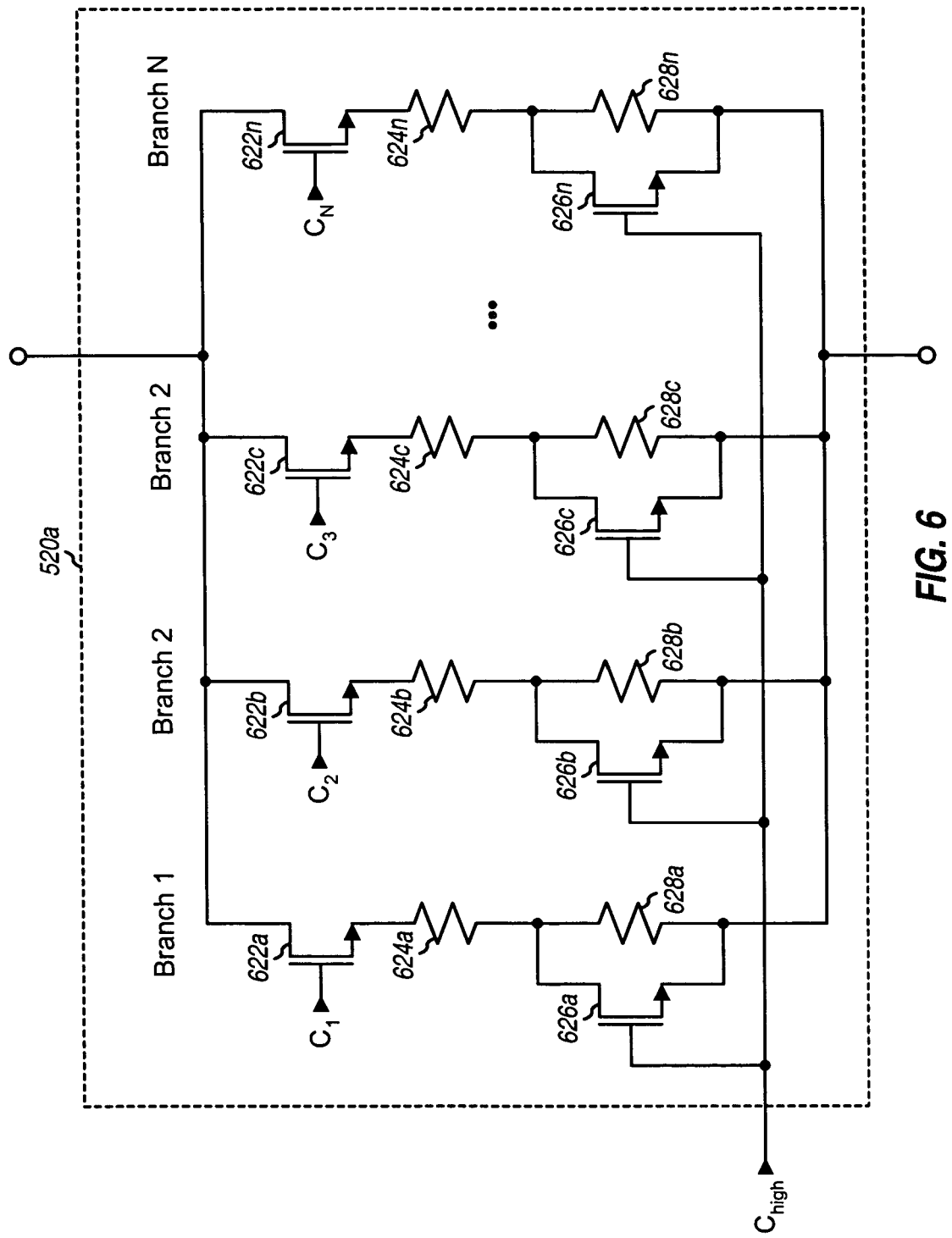
FIG. 6 shows a resistor array within the bias circuit.

FIG. 6 shows an embodiment of a resistor array 520a, which may be used for resistor 520 in bias circuit 510 in FIG. 5. Resistor array 520a includes multiple (N) resistor branches, where N>1. These resistor branches may be used to provide high and low gain settings for amplifiers 422 and 424, to provide different gains to achieve different temperature coefficients for these amplifiers, and to account for integrated circuit (IC) process variation. Each resistor branch corresponds to a different amplifier gain.

Each resistor branch includes two N-FETs 622 and 626 and two resistors 624 and 628. N-FET 622 has its drain coupled to a first common node, its gate receiving a control $C_n$, where $n \in \{1, 2, \ldots, N\}$, and its source coupled to one end of resistor 624. N-FET 626 has its drain coupled to the other end of resistor 624, its gate receiving a control $C_{high}$, and its source coupled to a second common node. Resistors 624 and 628 are coupled in series with N-FET 622, and resistor 628 is coupled in parallel with N-FET 626. The values of resistors 624 and 628 are selected to achieve a desired amplifier gain for the branch. Different amplifier gains may be achieved by using different resistor values for the N branches.

For each resistor branch, N-FET 622 acts as a switch that is opened or closed based on the associated $C_n$ control. When the $C_n$ control is at logic high, N-FET 622 is turned on, resistors 624 and 628 are coupled between the input and output of resistor array 520a, and the branch is engaged. Conversely, when the $C_n$ control is at logic low, N-FET 622 is turned off, and the branch is disengaged. N-FET 626 acts as a switch that is opened or closed based on the $C_{high}$ control. When the $C_{high}$ control is at logic high, N-FET 626 is turned on, resistor 628 is shorted, and a higher transconductance $g'_m$ is achieved since $g'_m$ is inversely related to $R_1$, as shown in equation (14). When the $C_{high}$ control is at logic low, N-FET 626 is turned off, resistor 628 is coupled in series with resistor 624, and a lower transconductance $g'_m$ is achieved with the higher resistor value for the branch.

For the embodiment shown in FIG. 6, $\lceil \log_2 N \rceil$ control bits may be used to select one of the N branches, where $\lceil\ \rceil$ denotes a ceiling operator. An additional control bit is used to select either the high or low gain setting. The high gain setting may be used to generate a large IM2 current. The low gain setting may be used to achieve better resolution and lower power consumption when a large IM2 current is not needed.

Figure 7:
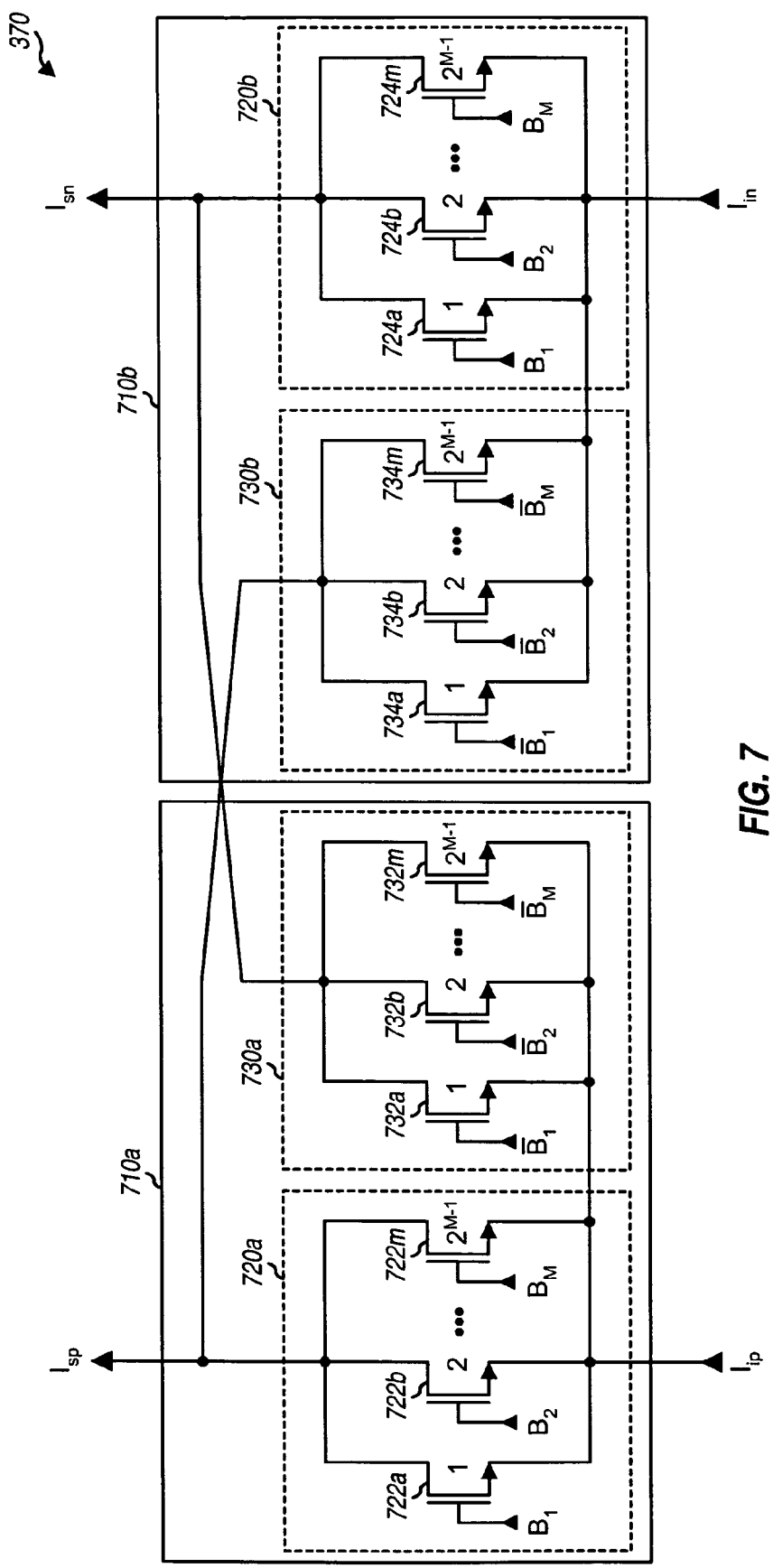
FIG. 7 shows a scaling unit.

FIG. 7 shows an embodiment of scaling unit 370, which may be used for each of scaling units 370a and 370b in FIG. 3. For this embodiment, scaling unit 370 is implemented as an M-bit Gilbert digital-to-analog converter (DAC), where M>1 and is determined by the desired scaling resolution. The Gilbert DAC receives differential current ($I_{ip}$ and $I_{in}$) for the intermediate signal from IM2 generator 360 at its inverting and non-inverting inputs, steers the input current to its inverting and non-inverting outputs, and provides differential current ($I_{sp}$ and $I_{sn}$) for the scaled signal from the scaling unit.

The Gilbert DAC includes two sections 710a and 710b. Each section 710 includes a direct-coupled block 720 and a cross-coupled block 730. For section 710a, direct-coupled block 720a includes M N-FETs 722a through 722m having their sources coupled to the non-inverting input $I_{ip}$ and their drains coupled to the non-inverting output $I_{sp}$. N-FETs 722a through 722m have widths of W, 2W, ..., and $2^{M-1} \cdot W$, respectively, and receive $B_1, B_2, \ldots,$ and $B_M$ control bits, respectively, for an M-bit control, where $B_1$ is the least significant control bit and $B_M$ is the most significant control bit. Cross-coupled block 730a includes M N-FETs 732a through 732m having their sources coupled to the non-inverting input $I_{ip}$ and their drains coupled to the inverting output $I_{sn}$. N-FETs 732a through 732m have widths of W, 2W, ..., and $2^{M-1} \cdot W$, respectively, and receive $\overline{B_1}, \overline{B_2}, \ldots,$ and $\overline{B_M}$ control bits for the M-bit control, where $\overline{B_m}$ is an inverted version of $B_m$ for m=1, ..., M.

For section 710b, direct-coupled block 720b includes M N-FETs 724a through 724m that have (1) the same dimension as N-FETs 722a through 722m, respectively, (2) their sources coupled to the inverting input $I_{in}$, (3) their gates receiving the $B_1, B_2, \ldots,$ and $B_M$ control bits, respectively, and (4) their drains coupled to the inverting output $I_{sn}$. Cross-coupled block 730b includes M N-FETs 734a through 734m that have (1) the same dimension as N-FETs 724a through 724m, respectively, (2) their sources coupled to the inverting input $I_{in}$, (3) their gates receiving the $\overline{B_1}, \overline{B_2}, \ldots,$ and $\overline{B_M}$ control bits, respectively, and (4) their drains coupled to the non-inverting output $I_{sp}$.

The differential output current from scaling unit 370 may be expressed as:

$$I_{sp} = x \cdot I_{ip} + (1-x) \cdot I_{in}, \text{ and} \qquad \text{Eq (18)}$$

$$I_{sn} = (1-x) \cdot I_{ip} + x \cdot I_{in},$$

where x is a normalized control value determined by the M control bits and is between a range of 0 and 1, or $0 \leq x \leq 1$. The B-bit control value may be denoted as X and ranges from 0 through $2^M - 1$. The normalized control value is then given as $x = X/(2^M - 1)$. A scaling gain provided by scaling unit 370 may be given as: $G = (X - X_{mid})/X_{mid}$, where $X_{mid}$ is the midscale control value, which is $X_{mid} = (2^M - 1)/2$.

Each control bit $B_m$ steers a portion of the $I_{ip}$ current, or $2^{m-1} \cdot I_{ip}/(2^M - 1)$, to the $I_{sp}$ output if that bit is set to logic high and to the $I_{sn}$ output if the bit is set to logic low. The same control bit $B_m$ also steers a portion of the $I_{in}$ current, or $2^{m-1} \cdot I_{in}/(2^M - 1)$, to the $I_{sn}$ output if that bit is set to logic high and to the $I_{sp}$ output if the bit is set to logic low. The current at the $I_{sp}$ output is equal to the sum of all currents steered to this output. Likewise, the current at the $I_{sn}$ output is equal to the sum of all currents steered to this output. Since the $I_{ip}$ current is 180° out of phase with respect to the $I_{in}$ current, steering the $I_{ip}$ current to the $I_{sp}$ output results in a reduction or an inversion of the current at the $I_{sp}$ output with respect to the $I_{ip}$ current. The same is true for the $I_{sn}$ output.

If all of the M bits are set to logic high, then x=1, $I_{sp}=I_{ip}$, $I_{sn}=I_{in}$, and scaling unit 370 provides a scaling gain of G=+1. Conversely, if all of the M bits are set to logic low, then x=0, $I_{sp}=I_{in}$, $I_{sn}=I_{ip}$, and scaling unit 370 provides a scaling gain of G=−1. If the M bits are set such that x=0.5, then $I_{sp}=0.5I_{ip}+0.5I_{in}=0$, $I_{sn}=0.5I_{ip}+0.5I_{in}=0$, and scaling unit 370 provides a scaling gain of G=0. Scaling unit 370 can thus adjust the magnitude and polarity of the IM2 current from IM2 generator 360.

Scaling units 370a and 370b may each be implemented as shown in FIG. 7. Separate M-bit controls may be used for scaling units 370a and 370b to allow for independent cancellation of IM2 distortions in the I and Q baseband signals from mixer cores 320a and 320b, respectively.

For clarity, specific embodiments of various circuits have been described above in FIGS. 3 through 7. These circuits may also be implemented with other designs, and this is within the scope of the invention. For example, IM2 generator 360 and scaling units 370a and 370b may be implemented with circuits that operate on voltages instead of currents.

Figure 8:
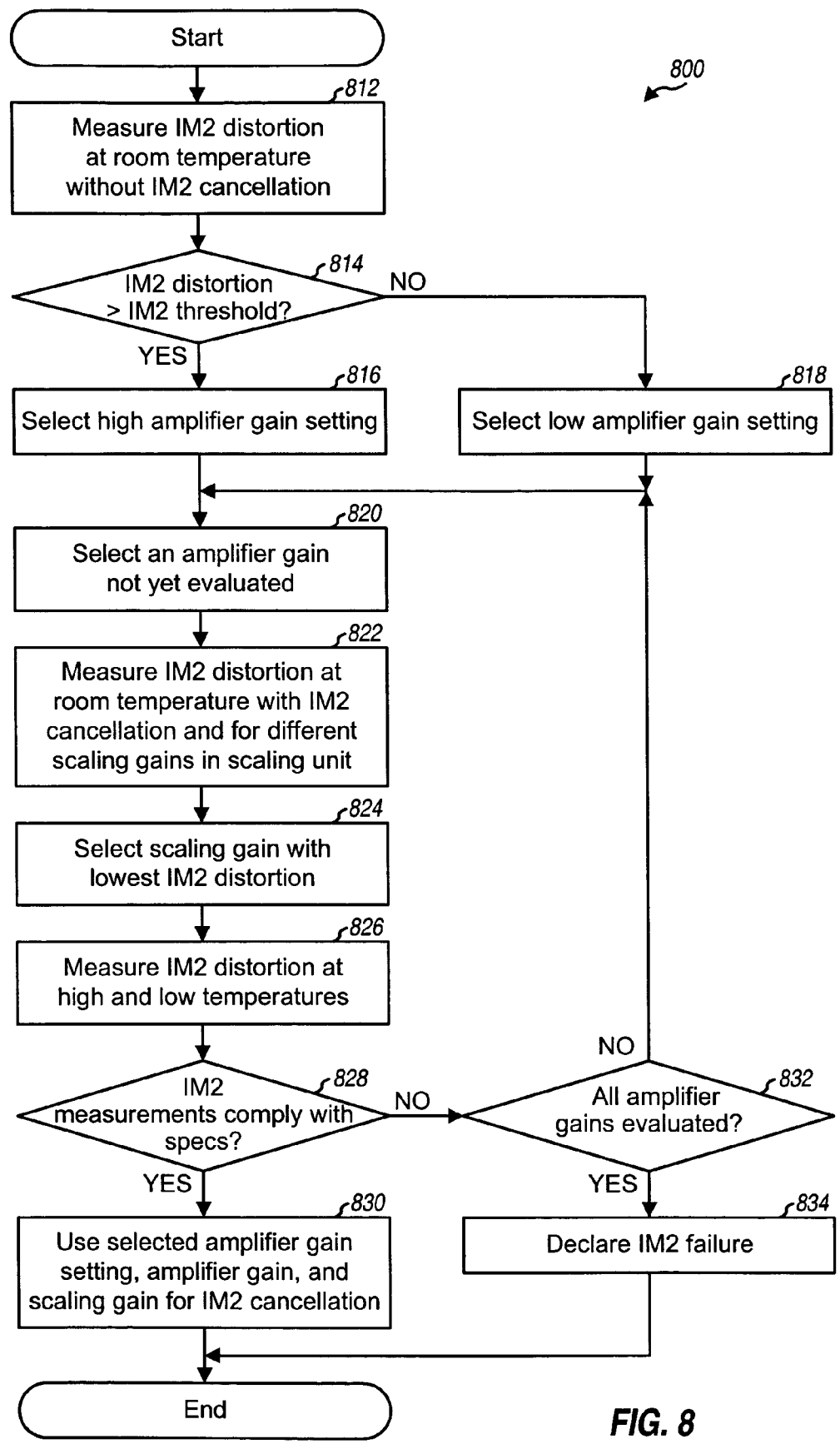
FIG. 8 shows a process for performing IM2 calibration for the receiver.

FIG. 8 shows a process 800 for performing IM2 calibration for receiver 100. Process 800 may be performed during manufacturing, testing, or field operation. Process 800 may also be performed independently for each of the I and Q baseband signals. For simplicity, the following description is for one baseband signal, which may be either the I or Q baseband signal.

Initially, IM2 distortion in the baseband signal is measured at room temperature without IM2 cancellation (block 812). A determination is then made whether the IM2 distortion exceeds a predetermined IM2 threshold (block 814). If the answer is 'Yes', then the high gain setting is selected for the amplifiers in IM2 generator 360 by setting the $C_{high}$ control to logic high (block 816). Otherwise, the low gain setting is selected by setting the $C_{high}$ control to logic low (block 818).

A resistor branch (i.e., an amplifier gain) that has not been evaluated is selected (block 820). The N resistor branches in resistor array 520a in FIG. 6 may be selected in sequential order, e.g., from the branch with the highest resistor value to the branch with the lowest resistor value. The N branches may also be selected in a ping-pong manner, e.g., starting with the middle resistor value and then alternating between higher and lower resistor values. In any case, the selected branch is enabled by setting the $C_n$ control bit for the branch to logic high and setting all other $C_n$ control bits to logic low.

IM2 distortion in the baseband signal is then measured at room temperature with IM2 cancellation and for different scaling gains in scaling unit 370 (block 822). The scaling gain with the lowest IM2 distortion is selected (block 824). IM2 distortion in the baseband signal is then measured at high and low temperatures with IM2 cancellation and using the selected scaling gain (block 826). A determination is then made whether the IM2 measurements comply with specifications (block 828). If the answer is 'Yes', then the selected gain setting and resistor branch for the amplifiers and the selected scaling gain for the scaling unit are used for IM2 cancellation (block 830). Otherwise, if the answer is 'No' for block 828, then a determination is made whether all resistor branches (i.e., all amplifier gains) have been evaluated (block 832). If the answer is 'No', then the process returns to block 820 to select and evaluate another resistor branch. If all resistor branches have been evaluated and the IM2 measurements still do not comply with specification, then IM2 failure is declared (block 834) and the process terminates.

In the description above, one amplifier gain setting, one amplifier gain (or resistor branch), and one scaling gain are selected by the calibration process in FIG. 8 and thereafter used for IM2 cancellation at all temperatures. Different amplifier gain settings, amplifier gains, and/or scaling gains may also be determined for different operating conditions and stored in a look-up table. Thereafter, the proper amplifier gain setting, amplifier gain, and scaling gain are used for the detected operating condition. The amplifier gain setting, amplifier gain, and scaling gain may also be selected during normal operation based on one or more parameters such as, for example, detected temperature, measured IM2 distortion in the baseband signals, receiver performance, and so on.

The downconversion mixer with IM2 cancellation described herein may be used for various communication systems. For example, the downconversion mixer may be used for Code Division Multiple Access (CDMA) systems, Time Division Multiple Access (TDMA) systems, Frequency Division Multiple Access (FDMA) systems, Orthogonal Frequency Division Multiple Access (OFDMA) systems, multiple-input multiple-output (MIMO) systems, wireless local area networks (LANs), and so on. A CDMA system may implement a radio access technology (RAT) such as Wideband CDMA (W-CDMA), cdma2000, and so on. RAT refers to the technology used for over-the-air communication. A TDMA system may implement a RAT such as Global System for Mobile Communications (GSM). Universal Mobile Telecommunication System (UMTS) is a system that uses W-CDMA and GSM as RATs. The downconversion mixer may also be used for various frequency bands such as, for example, a cellular band from 824 to 894 MHz, a Personal Communication System (PCS) band from 1850 to 1990 MHz, a Digital Cellular System (DCS) band from 1710 to 1880 MHz, an International Mobile Telecommunications-2000 (IMT-2000) band from 1920 to 2170 MHz, and so on.

The downconversion mixer described herein may be implemented within an integrated circuit (IC), an RF integrated circuit (RFIC), an application specific integrated circuit (ASIC), a printed circuit board (PCB), an electronic device, and so on. The downconversion mixer may also be fabricated with various IC process technologies such as complementary metal oxide semiconductor (CMOS), N-channel MOS (N-MOS), P-channel MOS (P-MOS), bipolar junction transistor (BJT), bipolar-CMOS (BiCMOS), silicon germanium (SiGe), gallium arsenide (GaAs), and so on.

The control function for the IM2 generator and scaling units may be implemented in hardware, software, or a combination thereof. For example, the control function may be implemented by controller 140 in FIG. 1 or some other unit. The control function may also be implemented with software modules (e.g., procedures, functions, and so on) that perform the functions described herein. The software codes may be stored in a memory unit (e.g., memory unit 142 in FIG. 1) and executed by a processor (e.g., controller 140). The memory unit may be implemented within the processor or external to the processor.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An integrated circuit comprising:
a mixer operative to frequency downconvert an input radio frequency (RF) signal with a local oscillator (LO) signal and generate an output baseband signal of a mixer core; and
an IM2 generator comprising first and second field effect transistors (FETs) operative to receive the input RF signal and generate an intermediate signal having second order intermodulation (IM2) distortion, wherein the intermediate signal is combined with the output baseband signal to cancel IM2 distortion in the output baseband signal of the mixer core, and wherein the IM2 generator further comprises first and second amplifiers, the first amplifier being coupled between a source and a gate of the first FET, and the second amplifier being coupled between a source and a gate of the second FET, wherein the first and second amplifiers have at least two gain settings for generating different amounts of IM2 distortion in the intermediate signal.

2. An integrated circuit comprising:
a mixer operative to frequency downconvert an input radio frequency (RF) signal with a local oscillator (LO) signal and generate an output baseband signal of a mixer core; and
an IM2 generator comprising first and second field effect transistors (FETs) operative to receive the input RF signal and generate an intermediate signal having second order intermodulation (IM2) distortion, wherein the intermediate signal is combined with the output baseband signal to cancel IM2 distortion in the output baseband signal of the mixer core, and wherein the IM2 generator further comprises first and second amplifiers, the first amplifier being coupled between a source and a gate of the first FET, and the second amplifier being coupled between a source and a gate of the second FET, wherein the first and second amplifiers have at least two selectable gains for generating IM2 distortion with at least two different temperature variation patterns.

3. An integrated circuit comprising:
a mixer operative to frequency downconvert an input radio frequency (RF) signal with a local oscillator (LO) signal and generate an output baseband signal; and
an IM2 generator comprising first and second field effect transistors (FETs) operative to receive the input RF signal and generate an intermediate signal having second order intermodulation (IM2) distortion, wherein the intermediate signal is used to cancel IM2 distortion in the output baseband signal; and
a scaling unit operative to scale the intermediate signal and generate a scaled signal and to combine the scaled signal with the output baseband signal to cancel the IM2 distortion in the output baseband signal, wherein the scaling unit comprises a plurality of transistors configurable to receive differential current for the intermediate signal at inverting and non-inverting inputs and to steer the differential current to inverting and non-inverting outputs.

4. The integrated circuit of claim 3, wherein the first and second FETs are N-channel FETs (N-FETs).

5. The integrated circuit of claim 3, wherein the mixer and the IM2 generator are implemented with field effect transistors.

6. An integrated circuit comprising:
a first mixer operative to frequency downconvert an input radio frequency (RF) signal with an inphase local oscillator (LO) signal and generate an inphase baseband signal;
a second mixer operative to frequency downconvert the input RF signal with a quadrature LO signal and generate a quadrature baseband signal;
an IM2 generator comprising first and second field effect transistors (FETs) operative to receive the input RF signal and generate an intermediate signal having second order intermodulation (IM2) distortion;
a first scaling unit operative to scale the intermediate signal to generate a first scaled signal and to combine the first scaled signal with the inphase baseband signal to cancel IM2 distortion in the inphase baseband signal; and
a second scaling unit operative to scale the intermediate signal to generate a second scaled signal and to combine the second scaled signal with the quadrature baseband signal to cancel IM2 distortion in the quadrature baseband signal.

7. The integrated circuit of claim 6, wherein the IM2 generator further comprises first and second amplifiers, the first amplifier being coupled between source and gate of the first FET, and the second amplifier being coupled between source and gate of the second FET.

8. The integrated circuit of claim 7, wherein the first and second amplifiers have at least two gain settings for generating different amounts of IM2 distortion in the intermediate signal.

9. The integrated circuit of claim 7, wherein the first and second amplifiers have at least two selectable gains for generating IM2 distortion with at least two different temperature variation patterns.

10. The integrated circuit of claim 6, wherein the IM2 generator further comprises a differential signal generator coupled to the first and second FETs and operative to generate differential first and second intermediate signals for the first and second scaling units, respectively.

11. The integrated circuit of claim 6, wherein the first scaling unit is operative to scale the intermediate signal with a first gain selected to reduce IM2 distortion in the inphase baseband signal, and wherein the second scaling unit is operative to scale the intermediate signal with a second gain selected to reduce IM2 distortion in the quadrature baseband signal.

12. A method of performing calibration for second order intermodulation (IM2) distortion in a receiver, comprising:
generating an intermediate signal having IM2 distortion based on an amplifier gain;
scaling the intermediate signal with a scaling gain to generate a scaled signal;
combining the scaled signal with an output baseband signal from a downconversion mixer to cancel the IM2 distortion in the output baseband signal;
measuring IM2 distortion in the output baseband signal; and
performing the generating, scaling, combining, and measuring steps for each of at least two scaling gains and for each of at least two amplifier gains.

13. The method of claim 12, further comprising:
selecting an amplifier gain and a scaling gain resulting in lowest IM2 distortion in the output baseband signal for use for IM2 cancellation.

14. The method of claim 12, wherein the measuring the IM2 distortion in the output baseband signal comprises measuring the IM2 distortion in the output baseband signal at a plurality of temperatures.

15. The method of claim 12, wherein the measuring the IM2 distortion in the output baseband signal comprises measuring the IM2 distortion in the output baseband signal at a single temperature for each of the at least two scaling gains, and
measuring the IM2 distortion in the output baseband signal at a plurality of temperatures for each of the at least two amplifier gains.

16. The method of claim 12, further comprising:
determining amplitude of the IM2 distortion in the output baseband signal without IM2 cancellation; and
selecting one of a plurality of gain settings based on the amplitude of the IM2 distortion, wherein IM2 cancellation may be preformed during normal operation of the downconversion mixer.

17. The method of claim 16, wherein the selecting one of the plurality of gain settings comprises
selecting a high gain setting if the amplitude of the IM2 distortion exceeds a predetermined threshold, and
selecting a low gain setting if the amplitude of the IM2 distortion does not exceed the predetermined threshold.

* * * * *